US010702889B2

(12) United States Patent
Forissier et al.

(10) Patent No.: US 10,702,889 B2
(45) Date of Patent: Jul. 7, 2020

(54) MODULAR, SUBMERSIBLE ULTRASONIC TUBULAR TRANSDUCER

(71) Applicant: CEDRAT TECHNOLOGIES, Meylan (FR)

(72) Inventors: Timothée Forissier, Saint-Nazaire-les-Eymes (FR); Nabil Bencheikh, Saint-Martin-le-Vinoux (FR); Frank Claeyssen, Meylan (FR); Alexandre Pages, Saint-Nazaire-les-Eymes (FR)

(73) Assignee: CEDRAT TECHNOLOGIES, Meylan (FR)

( * ) Notice: Subject to any disclaimer, the term of this patent is extended or adjusted under 35 U.S.C. 154(b) by 588 days.

(21) Appl. No.: 15/536,485

(22) PCT Filed: Nov. 25, 2015

(86) PCT No.: PCT/FR2015/053208
§ 371 (c)(1),
(2) Date: Jun. 15, 2017

(87) PCT Pub. No.: WO2016/097513
PCT Pub. Date: Jun. 23, 2016

(65) Prior Publication Data
US 2017/0341109 A1 Nov. 30, 2017

(30) Foreign Application Priority Data
Dec. 15, 2014 (FR) .................................... 14 62451

(51) Int. Cl.

| | |
|---|---|
| ***H01L 41/053*** | (2006.01) |
| ***H01L 41/09*** | (2006.01) |
| ***B06B 1/06*** | (2006.01) |
| ***B06B 3/00*** | (2006.01) |
| ***G10K 15/04*** | (2006.01) |

(Continued)

(52) U.S. Cl.
CPC .............. *B06B 1/0618* (2013.01); *B06B 3/00* (2013.01); *B08B 3/12* (2013.01); *G10K 11/24* (2013.01); *G10K 15/043* (2013.01); *H04R 17/10* (2013.01)

(58) Field of Classification Search
CPC ........... B06B 1/0618; B06B 3/00; B08B 3/12; G10L 11/24; G10K 15/043; H04R 17/00; H01L 41/053; H01L 41/09
(Continued)

(56) References Cited

U.S. PATENT DOCUMENTS 3,066,232 A 11/1962 Branson
4,016,436 A * 4/1977 Shoh ........................ B06B 3/00 310/322
(Continued)

FOREIGN PATENT DOCUMENTS

EP 0342446 A2 11/1989
EP 0 462 037 A1 12/1991
(Continued)

OTHER PUBLICATIONS

Shuyu Lin et al., "A New Type of High Power Composite Ultrasonic Transducer", Journal of Sound and Vibration, vol. 330, No. 7, Mar. 1, 2011 (Mar. 1, 2011), pp. 1419-1431, 2010.10.009 *p. 1419-p. 1421*.
(Continued)

*Primary Examiner* — Thomas M Dougherty
(74) *Attorney, Agent, or Firm* — Oliff PLC

(57) ABSTRACT

The ultrasonic tubular transducer is activated at the centre thereof by two symmetrical electromechanical converters. The vibration generated by the two electromechanical converters is converted and then transmitted to the tube via a coupler. The ultrasonic transducer can be vibrationally isolated from the interfaces thereof by caps equally suitable for
(Continued)

connecting the transducer to a stationary frame, a free end or another similar ultrasonic transducer. A device for pre-stressing electromechanical converters has a hole bored at the centre thereof in order to allow cables from the transducer as well as from adjacent transducers to pass therethrough.

11 Claims, 9 Drawing Sheets

(51) Int. Cl.

| | |
|---|---|
| ***B08B 3/12*** | (2006.01) |
| ***G10K 11/24*** | (2006.01) |
| ***H04R 17/10*** | (2006.01) |

(58) Field of Classification Search
USPC ......... 310/323.01, 323.02, 323.12, 325, 328, 310/329
See application file for complete search history.

(56) References Cited

U.S. PATENT DOCUMENTS

| | | | | |
|---|---|---|---|---|
| 4,537,511 | A | 8/1985 | Frei | |
| 5,130,953 | A | 7/1992 | Grosso | |
| 5,200,666 | A | 4/1993 | Walter et al. | |
| 5,994,818 | A | 11/1999 | Abramov et al. | |
| 6,342,747 | B1 | 1/2002 | Lee et al. | |
| 2003/0001458 | A1* | 1/2003 | Christensen | B08B 3/12 310/328 |
| 2012/0097752 | A1* | 4/2012 | Okano | B01F 3/04978 239/1 |
| 2015/0221854 | A1* | 8/2015 | Melz | H01L 41/053 310/328 |
| 2016/0181505 | A1* | 6/2016 | Karrai | H02N 2/0055 310/367 |

FOREIGN PATENT DOCUMENTS

| | | | |
|---|---|---|---|
| EP | 0542016 | A2 | 5/1993 |
| EP | 1 004 364 | A2 | 5/2000 |
| EP | 1065009 | A1 | 1/2001 |
| FR | 1260903 | A | 5/1961 |

OTHER PUBLICATIONS

Dec. 4, 2016 Search Report issued in International Patent Application No. PCT/FR2015/053208.

Apr. 12, 2016 Written Opinion issued in International Patent Application No. PCT/FR2015/053208.

* cited by examiner

*State of art*

MODULAR, SUBMERSIBLE ULTRASONIC TUBULAR TRANSDUCER

BACKGROUND OF THE INVENTION

The invention relates to an ultrasonic tubular transducer to propagate acoustic waves in a fluid medium, and comprising:

- an electromechanical conversion device with active elements associated with at least one metal tube transmitting the vibrations to the fluid medium,
- a transmission system of the vibrations between the conversion device and the tube,
- and a device for pre-stressing the active elements of said conversion device.

Tubular ultrasonic transducers enable radial vibrations to be created and waves able to cause cavitation to be propagated in media, in particular fluid media, and find their applications in precision cleaning or sonochemistry, such as extraction of substances or of particle deposition. Their purpose is in particular to generate ultrasounds:

- within the fluid and in proximity to the surface to be treated to maximize the efficiency of the installation,
- over the whole of the surface to be treated, which may have a length of up to several metres,
- with an amplitude that is as uniform as possible for the surface treatment to be homogeneous,
- in a direction perpendicular to the surface to be treated to limit losses and to maximize the efficiency.

State of the Art

High-power ultrasounds in a fluid medium are the basis of sonochemistry. High-power ultrasonic acoustic waves produce strong dynamic pressures. When the latter exceed the static pressure, they cause cavitation. Cavitation, which manifests itself in the form of microbubbles, generates a large quantity of local energy in the form of pressure and heat. The energy thus input to the medium can, depending on the applications, trigger or accelerate a chemical reaction, dissociate intimate bonded materials or mix fluid solutions, all of these effects falling within the field of sonochemistry. For example, it is possible to clean the surface of parts more quickly by generating cavitation in a fluid comprising solvents. It is also possible to perform deposition of particular compounds dissolved in the fluid medium on a surface to be treated such as a textile to give it antibacterial properties. Other examples of applications concern filter declogging, degassing, mixing, emulsification, extraction and fragmentation.

A preferential means for generating ultrasounds in a fluid consists in a transducer formed by an electromechanical converter and a sonotrode in the form of a tube placed in contact with the fluid. The electromechanical converter makes the sonotrode vibrate. The vibrations perpendicular to the surface of the sonotrode emit acoustic waves in the fluid.

The electromechanical converter is conventionally of Langevin type, i.e. formed by a stack of active materials, of annular piezoelectric ceramic type for example, pre-stressed between two counterweights of flexible material, of metallic type for example. This concept is to be found in the documents FR1260903 and EP0342446 with previously described electromechanical converters with respectively an external pre-stressing system (enabling solid pellets of active material to be used) and via the centre of the stack of active material (reducing the volume and improving the uniformity of the pre-stressing). The stack of active material is then supplied at its resonance frequency, which produces longitudinal vibrations in the axis of the converter, in a half wavelength. The pre-stressing enables the active material to be kept in compression and the contacts between all the elements of the stack to be ensured when the vibration amplitudes are high, thus preventing impacts and breakage of the active elements, even in the case of a high quality factor.

The sonotrode in contact on one side with the converter and on the other side with the fluid medium is a metal part, typically made from steel or from titanium, which generally takes a cylindrical shape and which can be solid or hollow.

For example, the document U.S. Pat. No. 4,537,511 presents a non-submersible transducer based on an electromechanical converter securedly united to a tube immersed in the fluid. The whole of the transducer formed by the converter and tube is excited in a longitudinal mode at several half wavelengths: the length of the transducer is an integral multiple of a vibration half wavelength. By means of this mode, the largest vibration produced is a longitudinal vibration of the end. It produces very high pressure waves, which causes the maximum cavitation of the transducer on its axis.

Nevertheless, it is not possible to fit two transducers in series, as the axial cavitation produced will disturb or even damage the transducer located nearby. Furthermore, radial vibrations are indeed produced but their amplitude is lower than the axial vibration. The known transducer is therefore not optimized to produce radial vibrations, which reduces the efficiency of methods based on the use of acoustic energy located around the tube. In addition, on account of the fact that excitation of the tube is performed on one side of the tube, the radial vibration along the tube is not symmetrical with respect to a plane perpendicular to the axis and passing via the centre of the tube. The vibration decreases along the tube when moving away from the electromechanical converter.

The document EP1065009 presents numerous geometric considerations on the tube so that the latter is tuned to match the electromechanical converter as best as possible to maximize the efficiency of the transducer. This document also presents a very schematic view of a configuration with several tubes and several successive converters and with two converters for one tube, one at each end of the tube in order to increase the possible treatment length by these transducers. These configurations are based on the axial vibration of the converters. They present the shortcoming of not proposing means for obtaining a homogeneous radial vibration.

The concept of transducers with two converters for a sonotrode in the form of a tube is presented subsequently and in detail in the document U.S. Pat. No. 5,200,666 under the name of push-pull transducer. The transducer uses a longitudinal mode. The tube in the centre of the transducer produces radial vibrations, but not the two ends. The acoustic field along the transducer cannot be homogeneous for the reasons given below.

In all the previous tubular transducer configurations, the tube is excited by a longitudinal vibration; the wavelength of the mechanical vibration in the tube is an integral sub-multiple of the longitudinal dimension of the tube. The latter therefore has to be tuned to the required operating frequency. The half wavelength (distance between two nodes) $\lambda/2$ in the material is equal to half of the ratio of the celerity c of the medium over the frequency f. $\lambda/2=\frac{1}{2}\,c/f$. For a frequency f=20 kHz, in steel where c=5600 m/s, the half wavelength (distance between 2 nodes) $\lambda/2$=14 cm. In titanium where c=4900 m/s, $\lambda/2$=12 cm.

The vibration generated in this way presents a drawback as the distance between the vibration nodes is about 12 to 14 cm for a tube. But when they are faced with the nodes which do not produce any vibrations, the acoustic fields in the fluid are reduced which is responsible for an absence of cavitation in a large area. This large half wavelength therefore causes a low homogeneity of the cavitation area which is detrimental when performing treatment of the surface involved. In an application such as deposition on textile, this results in an irregularity of the deposition and therefore a poor treatment quality.

In addition on account of the longitudinal origin of the vibration and of the damping provided by the fluid, the radial vibration amplitude of each antinode on the tube decreases with the distance from the generator. In practice, the vibration of the $5^{th}$ antinode is divided by 2 to 3 compared with the vibration of the $1^{st}$ antinode. A steel sonotrode using five half wavelengths of 14 cm has a length of 70 cm. A number of longitudinal half wavelengths equal to 5 being a practical maximum, this length of 70 cm is a practical maximum.

In configurations with two converters, the structure is symmetrical. On account of the previous limitations induced by the longitudinal mode, it is possible to double this length limit without however exceeding 1.5 m, except if sonotrodes with very inhomogeneous vibration amplitudes are accepted.

Furthermore their drawbacks remain that only the sonotrode is submersible and that the transducer cannot be used to produce a sonochemical treatment for large parts with a length of more than 1.5 m at 25 kHz. It is not possible to fit several transducers in series as the converters are not submersible and their longitudinal vibrations in the axis of the transducer would produce detrimental effects on the nearby adjacent transducer.

On account of this limitation in dimension and homogeneity, it is not possible to process large parts easily. Numerous requirements do however exist for ultrasonic cleaning of large parts or for sonochemical treatment.

The document EP0542016 presents a superposition method of signals of several frequencies in order to improve the homogeneity of the emitted vibration wave.

Although it is theoretically efficient, this solution requires the use of costly and complex electronics. It does not solve the problem of treatment of large dimensions.

The document U.S. Pat. No. 6,342,747 presents a concept of a symmetrical tubular transducer composed of two half tubes on each side of an electromechanical converter. This transducer is based on a single central converter transmitting axial vibrations to two tubular resonators. The transducer operates in longitudinal vibration mode of the tubes. In this concept, nothing produces radial vibrations in the central area of the transducer. The absence of radial vibration in this area will lead to a large reduction of the acoustic fields and an absence of cavitation. The acoustic field along the transducer will therefore be substantially inhomogeneous. Furthermore in this concept, immersion of the converter is made possible by a theoretical shrouding system the connection of which with a possible frame is not described in detail. In addition, this concept does not enable any modularity to be envisaged to deal with the problem of length of the transducer and of treatment of large parts.

The documents U.S. Pat. Nos. 4,016,436 and 5,994,818 present a concept which is based on a conventional electromechanical converter which sets in motion a tubular sonotrode immersed in the fluid. The sonotrode is excited in radial mode by a radial vibratory excitation produced by the converter. Some of the configurations described implement excitation of the tube by two converters placed at the ends. In both the documents, the transducer is not submersible and is not able to be used in series to treat large parts.

FIG. 1A represents a schematic cross-sectional view of a transducer (1) according to the prior art, described in the document U.S. Pat. No. 4,537,511. This known transducer is composed of an electromechanical converter (2), a transmission tube (3*a*) of the vibration to the outside medium, and an inertia mass (5) located opposite the converter. The vibration (6*a*) generated by the electromechanical converter (2) compresses the tube (3*a*) against the inertia mass (5), exciting the longitudinal vibration mode of the tube (4*a*), which is accompanied by a radial vibration of the tube. This radial vibration generates cavitation (7) in areas of the medium situated facing vibration antinodes. The cavitation (7) is represented schematically by bubbles. The radial vibration and induced cavitation decrease with the distance from the electromechanical converter (2).

The radial vibration is linked to the wavelength of the longitudinal mode of the tube, and therefore to the length of the tube which then has to be perfectly tuned to the frequency of the excitation signal which commands the electromechanical converter (2). In this longitudinal mode, the inertia mass (5) vibrates in translation (6*b*) along the z-axis and emits high-intensity axial ultrasonic acoustic waves, which also causes cavitation (7) in the z-axis of the transducer. This effect is not desirable when the acoustic energy has to be concentrated radially around the transducer, all the more so as it consumes electric power unnecessarily.

FIGS. 1B and 1C present two configurations of an ultrasonic transducer, the vectors representing the amplitude of the mechanical vibrations (14*a*, 14*b*) transmitting acoustic energy to the medium. The configurations are as follows:

- The transducer used is of the type described in the document U.S. Pat. No. 4,537,511, i.e. composed of an electromechanical converter (2) and a transmission tube (3*a*) of the vibration to the medium. In the configuration of FIG. 1B, two transducers (1) are fitted facing one another to increase the vibration generation length. The amplitude of vibration (14*a*) is decreasing along each transducer (1), and the attenuation ratio is about three between the electro-mechanical converter and the end of the tube. In addition, this scheme does not take account of the large amount of parasite vibratory waves transmitted by the ends of each transducer to the transducer opposite it. The actual behaviour is therefore impaired compared with this scheme.
- The transducer (13) according to the prior art described in the document U.S. Pat. No. 5,200,666 is composed (FIG. 1C) of two electromechanical converters (2) and a transmission tube (3*b*) of the vibration to the medium common to the two converters. The amplitude of vibration (14*b*) also decreases with the distance from the electromechanical converters (2). This configuration enables a vibration amplitude to be obtained with respect to a plane perpendicular to the z-axis passing through the centre of the transducer that is symmetrical, but not uniform. The total length is limited to a length of about that of two single transducers.

The above-mentioned state of the art highlights the following limitations for existing tubular transducers:

- Structure not totally submersible, not enabling implementation on large structures and in homogeneous manner.
- Length limited to 0.7 m in general and to about 1.5 m in the case of the push-pull transducer (document U.S. Pat. No. 5,200,666), which does not enable treatment of large parts, economically pertinent in the textile industry for example (width of 2 to 4 m), Non-homogeneous acoustic field along the transducer, conditioned by the resonance frequency and the dimensions of the tube, with in particular vibration nodes and antinodes located far from one another and a large decrease between the converter and the free end, which does not ensure a treatment homogeneity necessary for surface treatment applications for example.

Impossibility of completely immersing the electromechanical converter which considerably reduces the efficiency of the installation and which therefore increases the operating cost.

Object of the Invention

The object of the invention is to remedy these shortcomings, and more particularly the problems of generation of radial vibration intended for production of an acoustic field around the sonotrode that is relatively uniform and symmetrical with respect to a plane passing through the centre and perpendicular to the axis, and over large lengths.

The transducer according to the invention is characterized in that the conversion device is composed of two electromechanical converters arranged axially inside the tube, on each side of a coupler, which is located in the central part of the tube and in contact with the latter, and in that each end of the tube is equipped with a cap, the assembly forming a submersible symmetrical module.

This results in a maximum radial vibration of the tube. The transducer is made to vibrate by the central position of the vibration transmission part situated in the plane of symmetry with respect to the axis of symmetry of revolution of the transducer. The electromechanical conversion device is therefore protected by the sealed tube, providing the possibility of immersing the transducer. The central position of the vibration transmission part enables the amplitude of the radial vibration generated by the transducer to be rendered uniform, the amplitude decrease in fact taking place on each side of the centre of each module.

The transducer according to the invention enables a modular assembly. Each module is independent and can be connected to its adjacent module by the caps, thereby enabling an unlimited number of modules to be assembled, resulting in a limitless length, without affecting the performances of each module.

According to one feature of the invention, each independent module allows an optimal supply at the right frequency for a maximal efficiency. The caps can be equipped with a vibratory isolation device enabling the modules not to disturb and not to be disturbed by the other modules.

According to a preferred embodiment, the pre-stressing system of the electro-mechanical conversion device is hollow in order to enable routing of the power supply cables of the modules farthest away from the reference frame. The cables are secured on inlet and outlet of the drilling under a low mechanical tension to prevent them from heating by friction or from being subjected to a high mechanical tension during operation of the transducer.

The vibration transmitted radially to the tube generates a radial vibration of the tube at a much lower wavelength than that of the longitudinal vibration modes of conventional tubular transducers. The vibration nodes and antinodes are therefore only separated by a few centimetres (5 to 10 times less than for conventional tubular transducers), which enables generation of closer pressure waves enabling the homogeneity of certain methods based on the use of ultrasonic transducers to be improved.

According to one feature of the invention, the two electromechanical converters which compose the electromechanical conversion device can be supplied with identical frequency and amplitude signals, but with a phase difference between the two. The phase difference between the two signals thus translates a superposition of two signals exciting the device in two different modes: an axial vibration is added to the radial vibration of the tube, the combination of the two vibrations enabling the number of vibration nodes to be reduced which improves the homogeneity of the acoustic field produced and therefore of the processing in the fluid.

According to another embodiment, the modules of one and the same assembly are supplied by a single electronic circuit in order to limit the number of cables running inside the transducer.

According to one feature of the invention, the end modules are separated from the external mechanical interfaces via caps equipped with vibratory isolation devices, thereby enabling connection with any mechanical frame on one or both sides of the transducer. This also results in a reduction of the vibrations at the ends in the axis of the transducer.

Several sets of transducers can be housed in a single tank of a processing machine.

The surface to be treated by ultrasounds can be textile. In this case, the textile is guided around several transducers to increase the exposure to the ultrasounds. A strip of textile can thus be easily treated by this type of transducer in a specific treatment tank.

To recap, several features of the invention can be used either alone or in combination:

- the pre-stressing device of the active elements of each module comprises a pass-through axial passage to enable routing of the supply cables of the adjoined modules and of the opposite converter;
- the two electromechanical converters are supplied by AC voltages, either in phase or in opposite phase, to respectively obtain a first radial vibration mode of the tube or a second axial vibration mode of the tube;
- each electromechanical converter comprises a stack of active elements and a counterweight arranged opposite the central common coupler (10);
- the pre-stressing device is formed by a hollow rod passing through the two converters and the coupler, and by a pair of securing rings for compressing the stacks of active elements and their counterweights;
- the transmission tube of each module is composed of two adjoined symmetrical tubes with a coupler fitted therebetween;
- the cap of each module comprises a separating part to isolate the module in vibratory manner from its mechanical interfaces, in particular a connection to a frame, a connection to another juxtaposed module and a connection to a closing cap;
- the different modules are supplied by a common electronic circuit configured to reduce the number of cables running through the modules, using a mean resonance frequency for the excitation frequency of the system.

BRIEF DESCRIPTION OF THE DRAWINGS

Other advantages and features will become more clearly apparent from the following description of a particular embodiment of the invention, given for non-restrictive example purposes only and represented in the appended drawings, in which.

DESCRIPTION OF PARTICULAR EMBODIMENTS

Figure 1A:
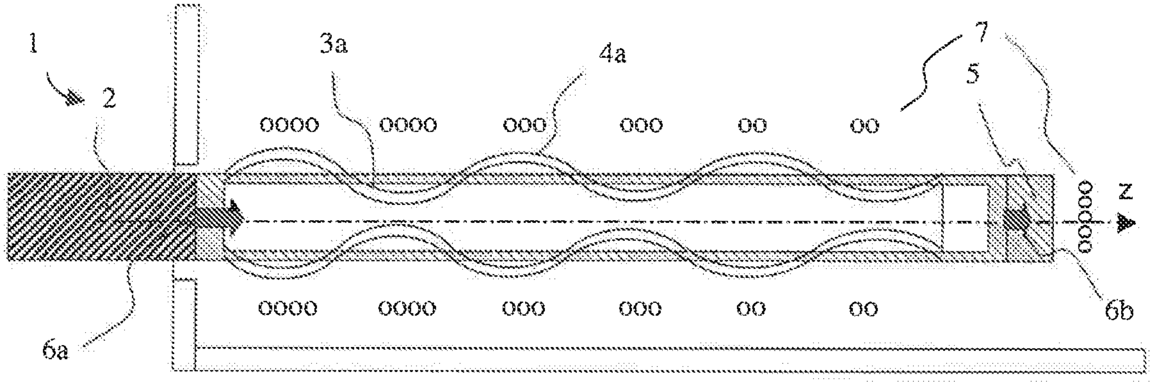
FIG. 1A represents a schematic view of a tubular transducer according to the prior art, described in the document U.S. Pat. No. 4,537,511.
Figure 1B:
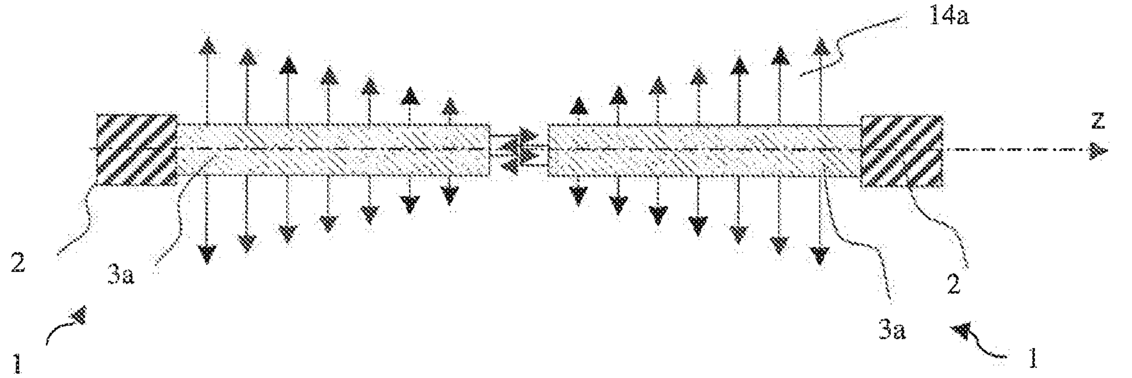
FIGS. 1B and 1C show the vibratory speed amplitude along two tubular transducers according to the prior art.
Figure 1C:
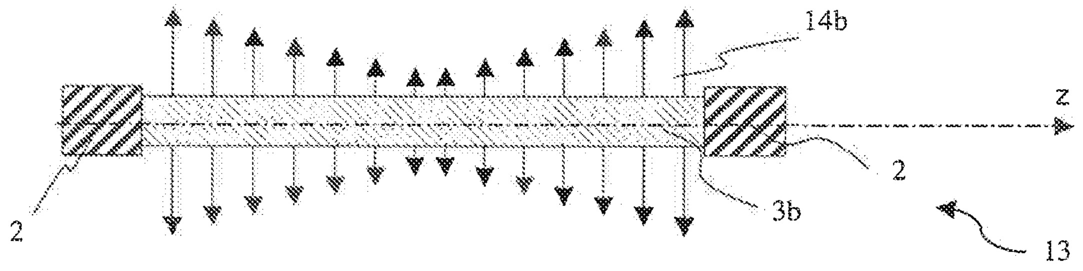
Figure 2A:
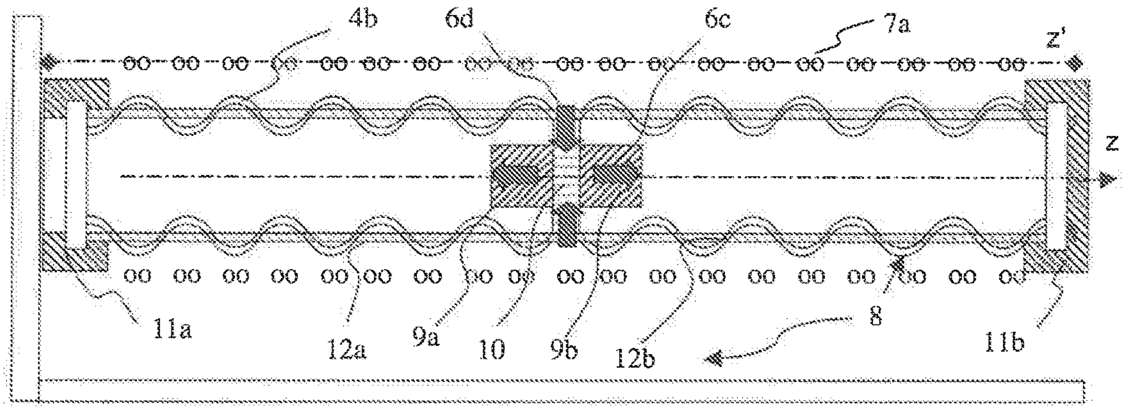
FIGS. 2A and 2B represent the vibratory deformation of a modular transducer according to the invention, with its two operating modes, and the respective generated cavitation fields.
Figure 2B:
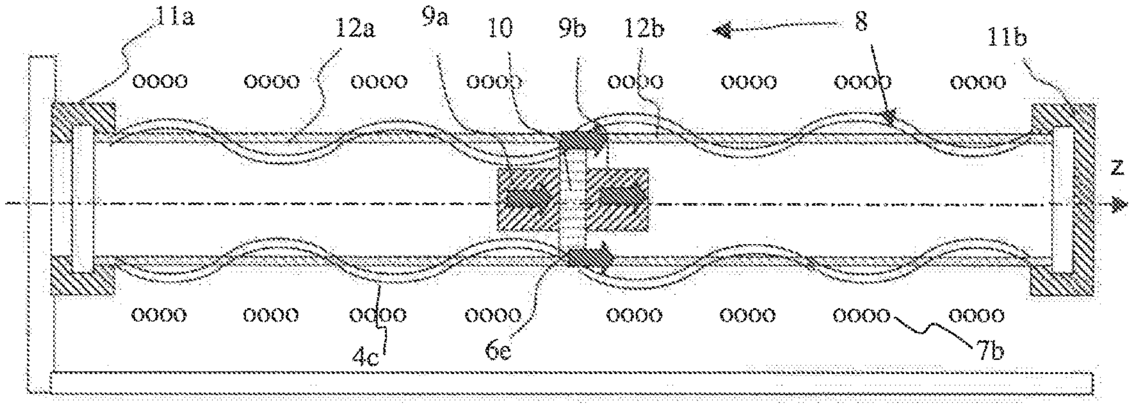

FIGS. 2A and 2B represent a symmetrical transducer (8) according to the invention illustrating two different operating modes.

In a first operating mode (FIG. 2A), called radial mode, the symmetrical transducer (8) is composed of two symmetrical electromechanical converters (9*a*, 9*b*), a coupler (10) and a tubular structure (12*a*, 12*b*) designed for radial acoustic generation. The two converters are placed along a z-axis, symmetrically on each side of the coupler (10), which is located in the central plane of the tubular structure (12*a*, 12*b*), formed by two adjoined tubes (12*a*, 12*b*) and aligned on the z-axis.

The two converters (9*a*, 9*b*) are excited in phase, which produces axial expansion vibrations (6*c*) in compression on the coupler (10). This device will then convert the axial vibration (6*c*) into radial vibration (6*d*). This radial vibration (6*d*) enables the radial vibration mode (4*b*) of the tubular structure (12*a*, 12*b*), designed for radial acoustic generation, to be excited.

The vibration thus develops according to the radial wavelength of the tube, i.e. a much lower wavelength than the wavelength of longitudinal mode. Typically it is possible to design the tubular structure (12*a*, 12*b*) in such a way that the half wavelength of the radial flexion mode is about 1 to 3 cm. This half wavelength is small compared with the length of a tube, typically 30 to 60 cm. This enables more than 10 half wavelengths to be placed on the tube. Co-relatively, this means that numerous radial vibration modes exist. It is therefore not necessary to adjust the length of the tubes to the excitation frequency of the electromechanical converters (9*a*, 9*b*), unlike a tubular transducer according to the prior art. There will always be a radial mode close enough in frequency to be excited at the resonance frequency of the vibration mode of the converters.

The caps (11*a*, 11*b*) arranged at the opposite ends of the tubes (12*a*, 12*b*) concentrate the vibrations on the cylindrical surface of the transducer and prevent generation of axial ultrasonic waves. As all the vibratory energy is produced on the cylindrical surface, the global efficiency of the transducer is increased for methods requiring acoustic power in an area containing the segment z' parallel to the z-axis of the transducer placed facing the cylindrical surface of the transducer.

In a second operating mode (FIG. 2B), called axial mode, the symmetrical transducer (8) according to the invention implements the two symmetrical electro-mechanical converters (9*a*, 9*b*) which are excited in opposite phase. This results in a translational vibration (6*e*), thereby resulting in a movement according to the z-axis of the coupler (10). This device will then transmit this vibration to the transmission tubes (12*a*, 12*b*) to the medium in which it is immersed. The vibration thus develops according to a longitudinal mode of the tube (4*c*), i.e. according to a similar mode to that of the transducer according to the prior art. The advantage of this mode alone is not determinant, however in combination with the previous mode, this double operating mode reduces the number of nodes, or even generates a progressive wave along the transducer, thereby resulting in a large homogenization of the applied treatment.

Figure 2C:
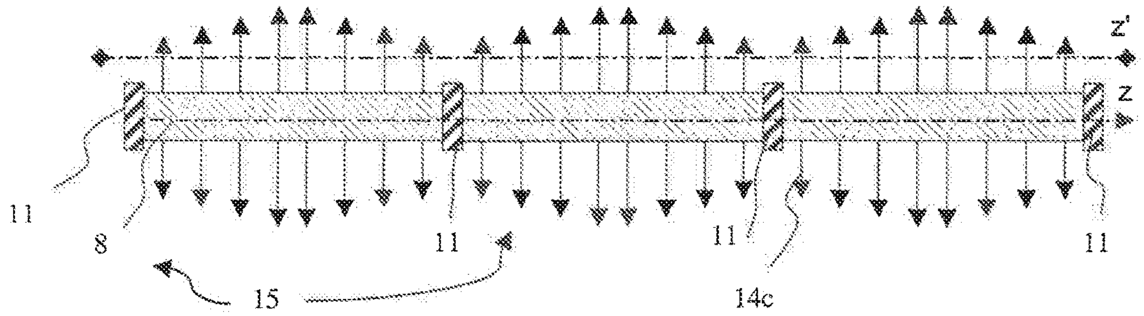
FIG. 2C illustrates the vibratory speed amplitude along the modular transducer of FIG. 2A.

FIG. 2C illustrates a set of modular transducers (15) according to the invention, composed of several transducers (8) of FIG. 2A or 2B and several caps (11). The vibration amplitude (14*c*) is symmetrical at the level of each module and the maximal attenuation ratio is low. The generated vibration amplitude profile is more regular than that of the other two configurations and the length is not limited. The acoustic energy, responsible for cavitation, is thus relatively homogeneous along a segment z' parallel to the z-axis. There is little acoustic energy produced in the z-axis, at the ends of the set of modular transducers (15).

The twofold symmetrical and modular property of the transducer according to the invention enables a more regular generated vibration amplitude to be obtained over larger treatment widths, which makes it possible to comply with the regularity and dimensional requirements of certain applications, involving ultrasonic treatment of large parts, such as depositions on textile assisted by ultrasounds.

Figure 3:
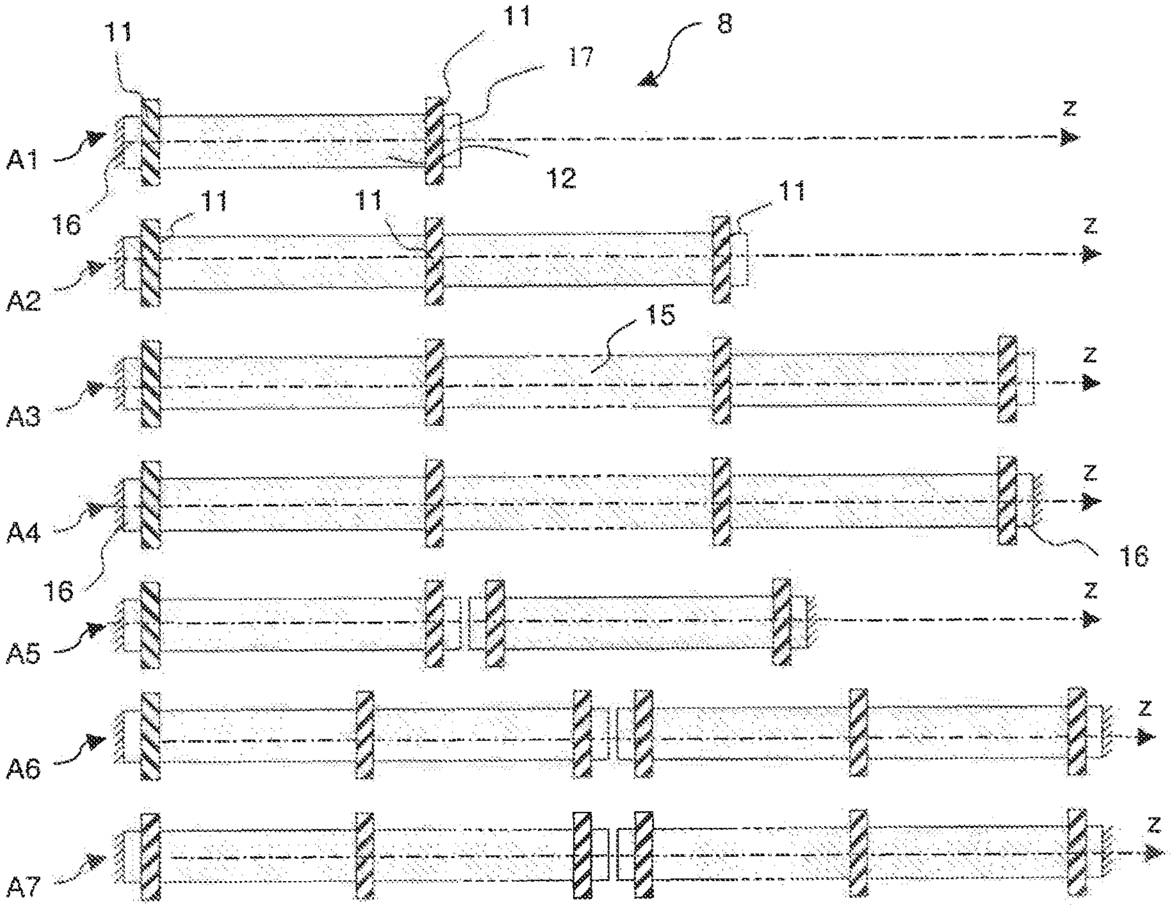
FIG. 3 represents the modularity and decoupling principle of the modules of the transducer according to the invention, with several examples of configurations.

FIG. 3 presents the configurations A1 to A7 made possible by the modular design of the ultrasonic transducer according to the invention. These configurations enable surface treatment problems to be addressed on very different widths and without any theoretical limitation. The modular transducer (8) is represented in simplified manner by its device for transmitting vibration to the medium (12) and its cap (11). The ends of the sets of transducers are composed by interfaces with a frame (16), a single shrouding (17) sealing the inside of the transducer, or another transducer modular according to the invention.

The configurations presented are the following:

A1, single module: the transducer module of the type of FIGS. 2A and 2B is fixed to a frame (16) via one end and in contact with the medium via the other end. The module is isolated in vibratory manner from the two ends by vibratory isolation devices integrated in the caps (11). This configuration enables a similar useful vibration generation length to that of a transducer according to the prior art to be obtained.

A2, two modules: this configuration is similar to configuration A1 with the addition of a transducer module in series with the previous module. In this configuration the decoupling device is common to the two modules. This configuration illustrates the modularity principle and enables the useful vibration generation length to be doubled.

A3, n modules: this configuration is similar to configurations A1 and A2 with an integral number [n−2] of modules (15) between the end modules. The interfacing principle between the modules remains identical to configuration A2. This configuration enables a theoretically infinite useful vibration generation length to be obtained.

A4, n modules, double embedding: this configuration is similar to configuration A3 with the two ends connected to a frame (16). This configuration enables the static flexion problem of the complete transducer to be reduced, which enables larger lengths to be achieved.

A5, two transducers with one facing module: this configuration presents two transducers as defined in configuration A1, placed facing one another in order to increase the vibration generation width. In addition, decoupling of the shrouding enables the disturbances generated by the transducers in the longitudinal direction to be reduced, thereby reducing the losses of performance encountered with tubular transducer is according to the prior art.

A6, two transducers with two facing modules: this configuration presents two transducers as defined in configuration A2, placed facing one another in the same way and for the same reasons as in configuration A5.

A7, two transducers with n facing modules: this configuration presents two transducers as defined in configuration A3, placed facing one another in the same way and for the same reasons as in configuration A5.

The nonrestrictive set of configurations permitted by the modularity and by the vibratory isolation of the modular transducer enables a large variety of problems to be addressed with a great flexibility as regards the vibration generation length.

Figure 4:
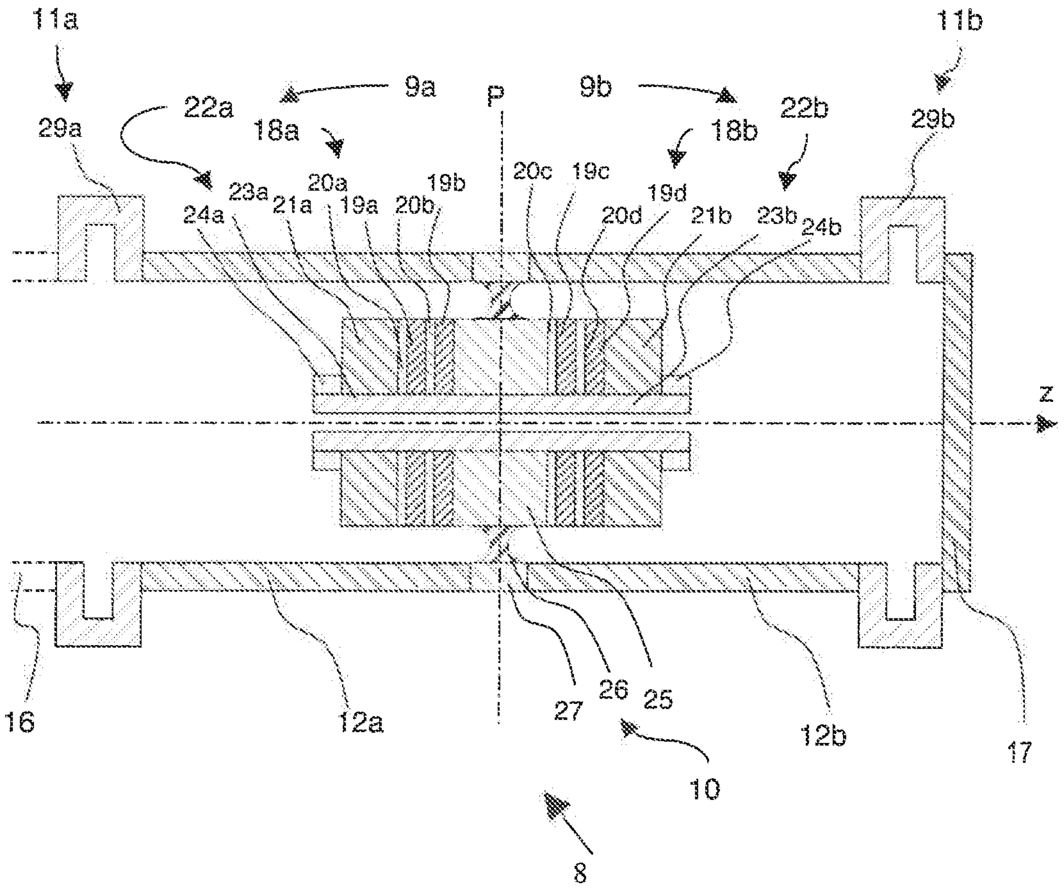
FIG. 4 represents a cross-sectional view of an embodiment of the ultrasonic transducer of FIG. 2A, in which the electromechanical conversion is performed by two converters formed by two stacks of symmetrical active elements and a drilled pre-stressing system, the mechanical vibration generated then being transmitted to two tubes for transmitting vibrations to the medium.

FIG. 4 presents an embodiment of a modular ultrasonic transducer according to FIGS. 2A and 2B. The transducer (8) is composed of two electromechanical converters (9*a*, 9*b*), a central coupler (10), a symmetrical device for transmitting vibration (12*a*, 12*b*) to the medium, and a device for performing symmetrical vibrating isolation in the caps (11*a*, 11*b*). The transducer is symmetrical with respect to the plane P, orthogonal to the axis of symmetry of revolution z.

The electromechanical converters (9*a*, 9*b*) are each composed of a stack of active elements (18*a*, 18*b*), a counterweight (21*a*, 21*b*) and a pre-stressing device (22*a*, 22*b*). The stacks of active elements are typically composed of successive layers of annular piezoelectric ceramics (19*a*, 19*b*, 19*c*, 19*d*) converting an electric signal into a mechanical vibration, and of electrodes (20*a*, 20*b*, 20*c*, 20*d*) performing supply of the active materials (18*a*, 18*b*).

The pre-stressing device is composed of a hollow pre-stressing rod (23*a*, 23*b*) which supports the pre-stressing and will enable electric wires to pass. Pre-stressing securing rings (24*a*, 24*b*) perform compression of the stacks of active elements (18*a*, 18*b*).

The active stacks (18*a*, 18*b*) are supplied by an AC electric voltage chosen to set the electromechanical converters (9*a*, 9*b*) in mechanical resonance with the central part (25). Two vibration modes are able to be used. Either the excitations are such that the deformations of the stacks (18*a*, 18*b*) are in mechanical phase to cause axial expansion-compression vibrations of the central part (25), or the excitations are such that the deformations of the stacks (18*a*, 18*b*) are in mechanical phase opposition to cause vibrations in axial movement of the central part (25).

With reference to FIG. 4, the coupler (10) comprises the central conversion part (25), a joining rim (26) and a transmission part (27). The joining rim (26) is in the form of a solid ring or of an apertured ring with regularly spaced holes along the z-axis. The symmetrical device for transmitting vibration (12) to the medium is composed of two identical tubes (12*a*, 12*b*) arranged in symmetrical manner around the coupler.

The central conversion part (25) converts the axial vibration generated by the electromechanical converters (18*a*, 18*b*) into radial vibration. This radial vibration is transmitted to the tubes (12*a*, 12*b*) via the joining rim (26) and transmission part (27).

According to an alternative embodiment, the symmetrical device for transmitting vibration (12) can be composed of a single tube containing the coupler (10) which acts via the inside of the tube in the plane of symmetry perpendicular to the z-axis.

In FIG. 4, the caps form a symmetrical vibratory isolation device of the transducer, composed of two identical decoupling parts (29*a*, 29*b*) arranged in symmetrical manner with respect to the plane P. These decoupling parts enable the transducer to be isolated in vibratory manner from its mechanical interfaces (30), in particular the connection to a frame (16), the connection to another transducer module or the connection to a single shrouding (17) at the end of the set of modular transducers. This vibratory isolation makes it possible not to dissipate a large amount of energy to set the frame in motion unnecessarily, not to disturb the performances of the transducers adjacent to the transducer concerned, and not to generate a large axial vibration at the end of the transducer. This vibratory isolation device is composed of two cylindrical parts forming a swelling of the tube in order to prevent the creation of cavities and risks of premature wear of the system on account of the cavitation generated by the mechanical waves in the fluid medium.

Figure 5:
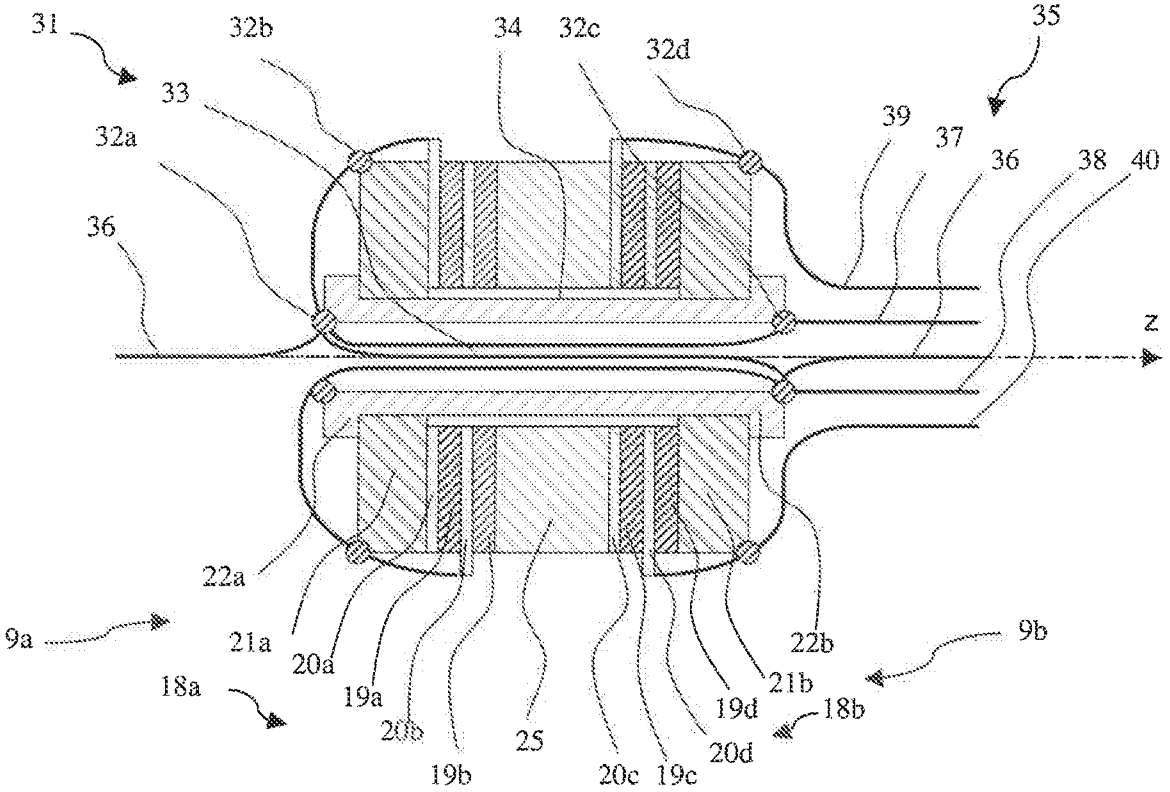
FIG. 5 shows the routing and securing of cables inside a transducer module according to FIG. 4.

FIG. 5 presents a detailed view of the central part of the ultrasonic transducer of FIG. 4. It illustrates all the arrangements made to manage securing and routing of the power supply cables (31). The two electromechanical converters (9*a*, 9*b*) are separated by the vibration conversion part (25). Each electromechanical converter is composed of the pre-stressing device (22*a*, 22*b*) which securedly maintains the counterweight (21*a*, 21*b*) and the stack of active elements (18*a*, 18*b*), successively composed of electrodes (20*a*, 20*b*, 20*c*, 20*d*) and of active materials (19*a*, 19*b*, 19*c*, 19*d*), under mechanical tension with the central part (25).

The cables coming from the electrodes are secured (32*a*, 32*b*, 32*c*, 32*d*) at the level of the edges of the counterweights and of the edges of the pre-stressing devices, for example by means of a spot of glue. In the areas situated between the securing points at the level of the edges of the pre-stressing devices (33), the mechanical tension of the cables is voluntarily very low ("slack loop") in order to limit the mechanical tension in the cables during operation of the transducer. An isolation cylinder (34), which can be electrically conducting in order to prevent short-circuiting, is located between the electrodes and the pre-stressing device. This cylinder can be formed by an insulating material such as Teflon (registered trademark).

The cable sheath (35) exiting from a transducer according to the invention is composed of the cable sheath coming from the transducer located upline (36), from the neutral cable of converter 9*a* (37), from the phase cable of converter 9*a* (38), from the neutral cable of converter 9*b* (39) and from the phase cable of converter 9*b* (40).

Figure 6:
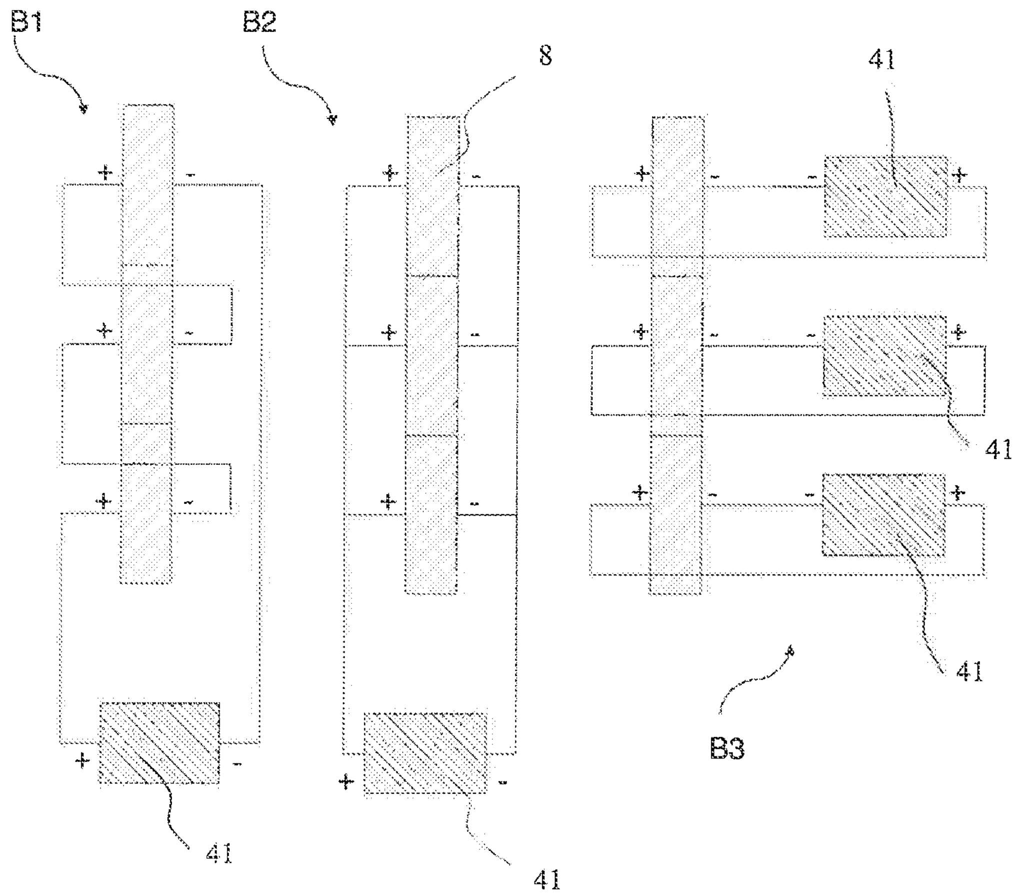
FIG. 6 represents several electronic power supply configurations for modular ultrasonic transducers according to the invention for which the modules can be supplied in series, in parallel or independently.

FIG. 6 presents different possible configurations for performing power supply to a set of three transducer modules (8) according to the invention by means of a specific power supply (41). Configurations B1 to B3 presented are applicable to a number of different transducers:

B1, series power supply: In this configuration, the transducers are connected in series on a single power supply (41). As the stacks of active elements behave as capacitors, the necessary voltage is greatly increased, but the current on the other hand does not change.

Power supply (41) is formed by a frequency and voltage generator, for example 500V and 25 kHz.

B2, parallel power supply: In this configuration, the transducers are connected in parallel on a single power supply (41). The capacitive behaviour of the stacks of active elements results in an increase of the required current without any increase of the voltage.

B3, independent power supplies: In this configuration, each transducer is provided with its own power supply (41). In this way, the supply frequency can be tuned to the resonance frequency of each transducer and the current and voltage requirements do not change according to the number of modules. The number of power supplies does on the other hand have to be adjusted.

Figure 7:
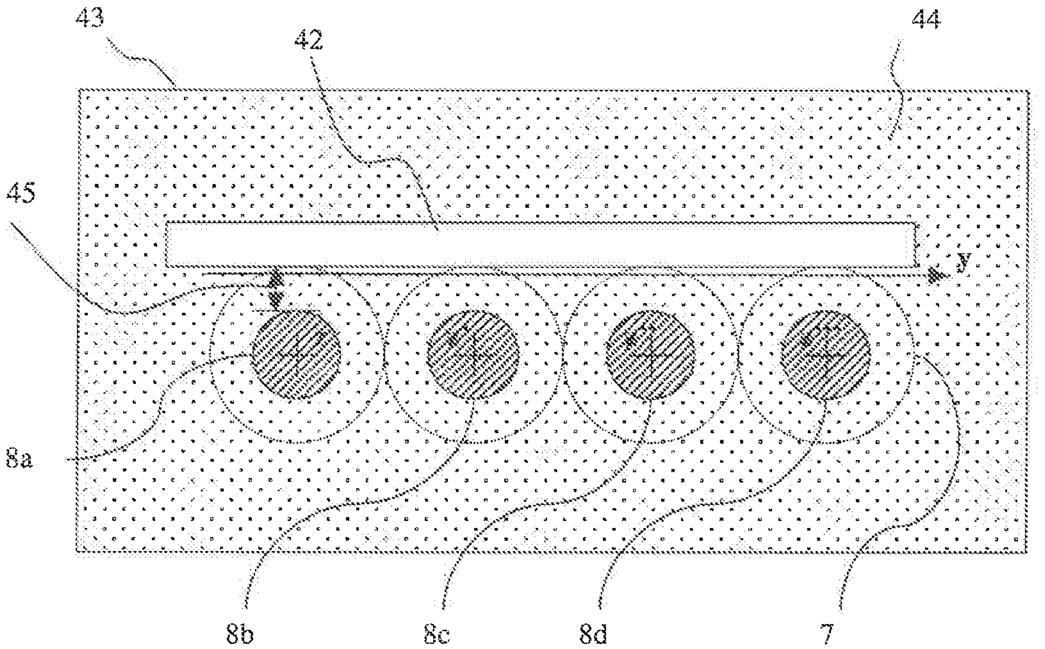
FIG. 7 is a schematic cross-sectional view of a configuration of a tank including a part exposed to the ultrasounds generated by the transducer according to the invention.

FIG. 7 presents a preferential configuration of implementation of an ultrasonic transducer housed in a tank (43) filled with a fluid (44) and designed to perform a sonochemical treatment such as cleaning of a part by ultrasounds. The distance (45) between the part (42) and transducer (8*a*, 8*b*, 8*c*, 8*d*) is chosen as a half wavelength in the generated wave medium. The objective is to maximize the pressure amplitude in the medium at the location where the surface to be treated is passed. The cavitation (7) is thus maximal on the surface to be treated in order to maximize the efficiency of the sonochemical treatment. This configuration is suitable both for batch treatment and for continuous treatment. In the case of a part (42) that is long along the y-axis, the part can be moved along this y-axis to be treated in the direction of its length in the z direction.

Figure 8A:
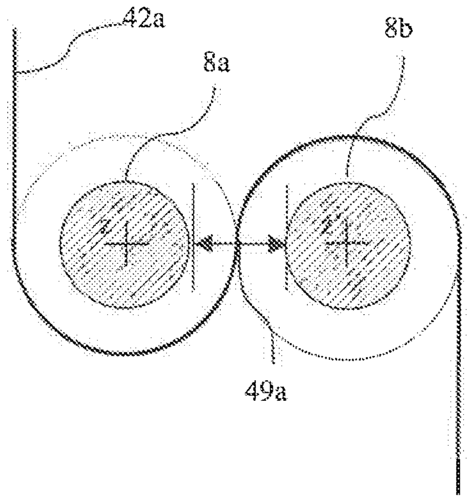
FIGS. 8A and 8B represent two arrangements of several modular transducers according to the invention in a medium so as to maximize the acoustic amplitude transmitted to the medium at the surface of a textile strip to be processed.
Figure 8B:
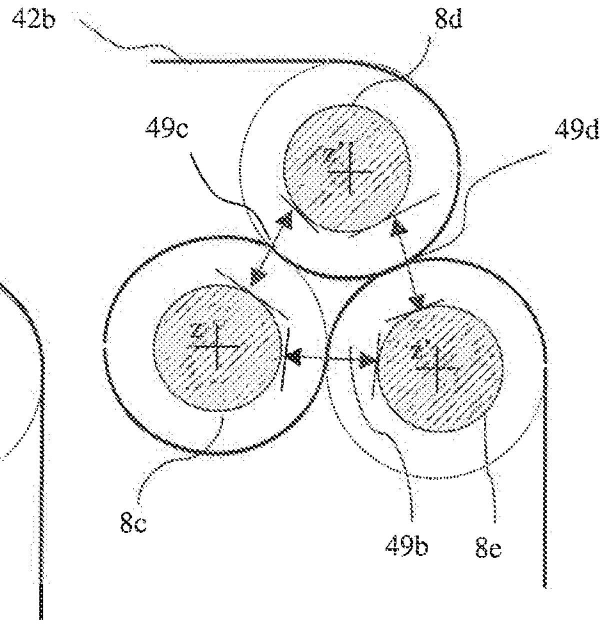

FIGS. 8A and 8B present other configurations for ultrasonic transducers (8*a*, 8*b*, 8*c*, 8*d*, 8*e*) or a set of transducer modules in any medium, designed to treat a strip of material (42*a*, 42*b*) by sonochemistry. The material can for example be textile or aluminum. The strip of material is unwound continuously in front of the transducers, at a suitable speed for sonochemical treatment. The surfaces of the strips of material (42*a*, 42*b*) to be treated by ultrasounds are unwound around the transducers in order to maximize the efficiency of their use. In the embodiment where the transducers are supplied in phase, the transducers (8*a*, 8*b*) are separated by a distance (49*a*, 49*b*, 49*c*, 49*d*) equal to a wavelength in the generated wave medium in order to maximize the pressure amplitude in the medium at the location where the surface to be treated is passed. The objective is to ensure that the acoustic energy, and the cavitation if applicable, are maximal on the surface to be treated in order to maximise the efficiency of the sonochemical treatment.

In a particular embodiment, several transducers are present in a tank (43) and the distance (49*a*, 49*b*, 49*c* and 49*d*) between each set of transducers (8*a*, 8*b*, 8*c*, 8*d* and 8*e*) is equal to the wavelength in the medium. This configuration enables the pressures to be maximized at a distance of a half wavelength. It is at this distance from the transducers that it is recommended to place the surface to be treated in order to maximise the efficiency of the sonochemical treatment. To treat a textile strip, it will therefore be advantageous to make it follow a trajectory placing it at half of the distance (49*a*, 49*b*, 49*c* and 49*d*) between each transducer. The configuration with 3 transducers makes it possible to double the exposure surface of the surface while only increasing the number of transducers by 50%.

Figure 9:
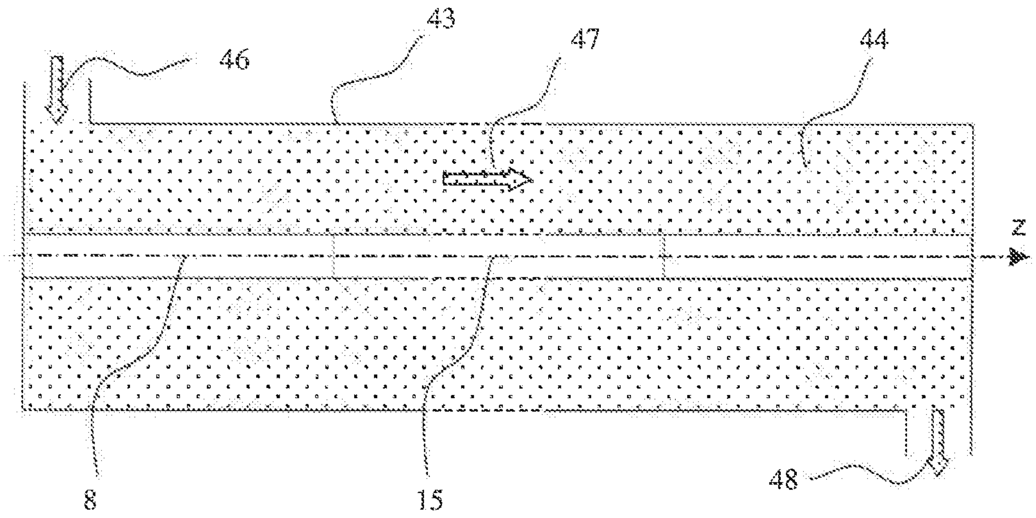
FIG. 9 represents a configuration of a coaxial cylindrical tank with the transducer according to the invention.

FIG. 9 presents another preferential configuration of implementation of a modular ultrasonic transducer (8) in a tank (43) designed to perform a continuous-flow fluid treatment (47). The tank (43) is of cylindrical shape with a fluid inlet (46) and a fluid outlet (48) at each end. The transducer is placed in coaxial manner with the tank (43) in order to maximize its efficiency on the fluid (44). This configuration enables a uniform ultrasonic treatment of the fluid the exposure time of which depends on the fluid flowrate and on the number n of transducer modules (15) used.

The invention claimed is:

1. Tubular ultrasonic transducer to propagate acoustic waves in a fluid medium, and comprising:

an electromechanical conversion device with active elements associated with at least one metallic tube for transmitting vibrations to the fluid medium, power supply cables of the conversion device, and a pre-stressing device of the active elements of said conversion device, wherein the conversion device is composed of two electromechanical converters arranged axially inside the tube, on each side of a coupler, which is located in the central part of the tube and in contact with the latter, and each end of the tube is equipped with a cap, the assembly forming a submersible symmetrical module with radial vibration.

2. Ultrasonic transducer according to claim 1, wherein the pre-stressing device of the active elements of each module comprises a pass-through axial passage to enable routing of the power supply cables of the adjoined modules and of the opposite converter.

3. Ultrasonic transducer according to claim 1, wherein the two electromechanical converters are supplied by AC voltages, either in phase or in opposite phase, to respectively obtain a first radial vibration mode of the tube or a second axial vibration mode of the tube.

4. Ultrasonic transducer according to claim 1, wherein each electromechanical converter comprises a stack of active elements and a counterweight arranged opposite the common central coupler.

5. Ultrasonic transducer according to claim 4, wherein the pre-stressing device is formed by a hollow rod passing through the two converters and the coupler, and a pair of securing rings for compressing the stacks of active elements and their counterweights.

6. Ultrasonic transducer according to claim 1, wherein the transmission tube of each module is composed of two adjoined symmetrical tubes with interposition of the coupler.

7. Ultrasonic transducer according to claim 1, wherein the cap of each module comprises a decoupling part to isolate the module from its mechanical interfaces in vibratory mode, in particular a connection to a frame, a connection to another juxtaposed module and a connection to a closing cap.

8. Modular assembly of a plurality of transducers according to claim 1, wherein the different modules are supplied by a common electronic circuit configured to reduce the number of cables running through the modules, using a mean resonance frequency for the excitation frequency of the system.

9. Treatment machine comprising a tank in which a set of transducers according to claim 8 are housed, and a surface to be treated by ultrasounds, wherein the surface to be treated is located at a distance from the surface of the tube substantially equal to a half wavelength in the medium of the transducer.

10. Treatment machine according to claim 9, wherein the surface to be treated by ultrasounds is a strip of material, guided around several transducers to increase.

11. Treatment machine comprising a tank in which a set of transducers according to claim 8 is housed, wherein the tank is of cylindrical shape, the fluid being inlet at one end and outlet at the other end to enable a continuous-flow treatment, and the transducers are arranged in substantially coaxial manner in said tank.

* * * * *